US 6,696,846 B1

(12) United States Patent
Shieh et al.

(10) Patent No.: US 6,696,846 B1
(45) Date of Patent: Feb. 24, 2004

(54) SELF-BALANCED ACTIVE CURRENT BRIDGE FOR MEASURING THE IMPEDANCE OF AN EXTERNAL DEVICE

(75) Inventors: Wen-Lung Shieh, Taipei (TW); Chih-Hung Tseng, Taipei (TW)

(73) Assignee: C-Media Electronics Inc., Taipei (TW)

( * ) Notice: Subject to any disclaimer, the term of this patent is extended or adjusted under 35 U.S.C. 154(b) by 0 days.

(21) Appl. No.: 10/228,706

(22) Filed: Aug. 27, 2002

(30) Foreign Application Priority Data

Aug. 23, 2002 (TW) ........................................ 91119191 A

(51) Int. Cl.[7] ............................................. G01R 17/10
(52) U.S. Cl. ........................................ 324/725; 324/713
(58) Field of Search ................................. 324/611, 657, 324/691, 706, 725, 713, 600, 522; 327/524, 588

(56) References Cited

U.S. PATENT DOCUMENTS 5,225,784 A * 7/1993 So ............................. 324/657
5,457,393 A * 10/1995 Trolle ......................... 324/607
5,703,490 A * 12/1997 Kennedy .................... 324/650

* cited by examiner

Primary Examiner—N. Le
Assistant Examiner—Vincent Q. Nguyen
(74) Attorney, Agent, or Firm—Perkins Coie LLP

(57) ABSTRACT

A self-balanced active current bridge for measuring the impedance of an external device or an output current, including an input potential source and operation amplifier connected to the input potential source via a first input terminal of the operation amplifier. A balancing bridge is coupled to a first output terminal and a second output terminal of the operation amplifier. A controlled potential source is coupled to the balancing bridge and used to maintain the balance state of the balancing bridge. A resistance is connected between the balancing bridge and an output terminal of the controlled potential source. Wherein the external device is connected a first node between the balancing bridge and a second input terminal of the operation amplifier. Wherein the controlled potential source is coupled to the balancing bridge to maintain the balance state, thereby constructing the self-balanced active current bridge for measuring the impedance of the external device or the output current by means of measuring the parameters of the resistance.

12 Claims, 1 Drawing Sheet

SELF-BALANCED ACTIVE CURRENT BRIDGE FOR MEASURING THE IMPEDANCE OF AN EXTERNAL DEVICE

CROSS-REFERENCE TO RELATED APPLICATION(S)

This application claims the benefit of Taiwan Patent Application No. 91119191, filed Aug. 23, 2002, which is hereby incorporated by reference in its entirety.

TECHNICAL FIELD

The present invention relates to a balancing scheme for detecting the output current of the signal source or the impedance of the plugged external device, and specifically, to a self-balanced active current bridge for measuring the impedance of the external device or the output current.

BACKGROUND

There is a proposal provided by the operating system platform maker Microsoft for analog audio device classification, in order to operating systems to properly configure analog audio, based their device type, operation system platform maker recommends that manufactures design their devices to their required impedance criteria. For example, they require the impedance of the microphone is about 400 to 1500 ohms, the impedance of the powered speaker is about 3000 to 12000 ohms, and the one of the passive speaker ranges from 4 to 16 ohms. The data collected for headphone includes impedance measured above 32–100 ohms range. Under such consideration, when the user plugs external device into the computer system, the system will detect the impedance of the device, if the user plugs the device into a wrong connector then the system will alarm the user to re-plug.

The current is typically detected by serially connecting a current meter to read the data or by an inductance coil to achieve the purpose. In the method, the magnetic field generated by the current flows through the inductance coil will induction potential thereon that can be measured. The typical method has a limitation for implanting them into ICs. It is unlikely to integrate the scheme into the single chip circuit. If we would like to detect the current by using the serially connected resistance, the resistance itself alters the scheme under measuring and will influence the accurate data, it is hard to decide the range of the resistance.

If the meter is used to measure the impendent, the device under measuring will be implant into the circuit and become one part of the bridge circuits. Therefore, a lot of switchers are needed and the cost is also increased.

SUMMARY

The yet object of the present invention is to provide a self-balanced active current bridge for measuring the output current of the input signal source.

A self-balanced active current bridge for measuring the impedance of an external device or an output current, comprising an input signal source and operation amplifier connected to the input potential source via a first input terminal of the operation amplifier. A balancing bridge is coupled to a first output terminal and a second output terminal of the operation amplifier. A controlled potential source is coupled to the balancing bridge and used to maintain the balance state of the balancing bridge. A resistance is connected between the balancing bridge and an output terminal of the controlled potential source. Wherein the external device is connected a first node between the balancing bridge and a second input terminal of the operation amplifier. Wherein the controlled potential source is coupled to the balancing bridge to maintain the balance state, thereby constructing the self-balanced active current bridge for measuring the impedance of the external device or the output current by means of measuring the potential variation of the resistance. The balancing further comprising:

a first driving means for providing current to the external device;

a second driving means, wherein the first driving means and the second driving means are connected to a reference voltage of voltage supplier and ground potential, thereby constructing the balancing bridge;

wherein the controlled potential-source is coupled the output of the second driving means for sending current or potential to the balancing bridge, and there is a feedback system formed between the balancing bridge and the controlled potential source for the second driving means to follow the change of the first driving means, thereby maintain the balancing state and obtaining the output state of the external device driven by the first driving means by using the second driving means.

The first driving means is consisted of a first PMOS transistor and a first NMOS transistor, the second driving means is consisted of a second PMOS transistor and a second NMOS transistor. The gates of the first PMOS transistor and the second PMOS transistor are coupled to the first output terminal of the operation amplifier. The gates of the first NMOS transistor and the second NMOS transistor are coupled to the second output terminal of the operation amplifier.

The sources of the first PMOS transistor and the second PMOS transistor are coupled to the reference voltage. The drain of the first PMOS transistor is coupled to the drain of the first NMOS transistor, wherein the drain of the second PMOS transistor is coupled to the drain of the second NMOS transistor. The sources of the first NMOS transistor and the second NMOS transistor are coupled to the ground potential. The first node is coupled to the common drain of the first PMOS transistor and the first NMOS transistor. The resistance is connected to the second driving means via a second node that is coupled to the common drain of the second PMOS transistor and the second NMOS transistor The output potential of the controlled potential source is the function of the difference potential between the first and second input terminals, wherein the first input terminal of the controlled potential source is coupled to the second input terminal of the operation amplifier via the common drain of the first PMOS transistor and the first NMOS transistor, and the second input terminal of the controlled potential source is coupled to the common drain of the second PMOS transistor and the second NMOS transistor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION

Figure 1:
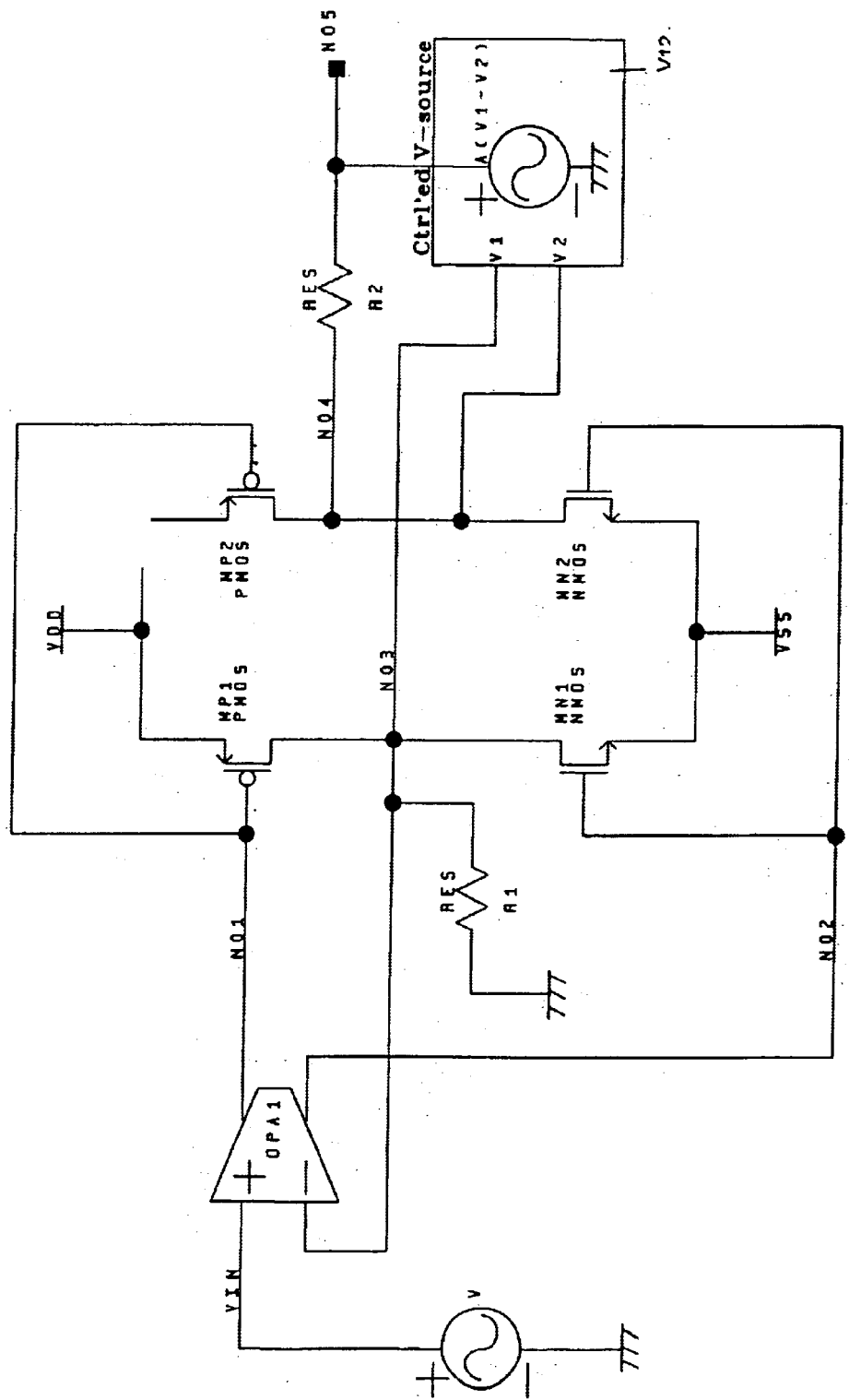
FIG. 1 is a scheme of the circuit in accordance with the present invention.

The circuit previously described fails to measure the impedance of the external device accurately. The invention provides a scheme to obtain the purpose for self-balanced measurement of the external device impedance.

Turning to FIG. 1, a scheme of the present invention is depicted. The circuit includes an operation amplifier OPAL connected to an input signal source V1. A PMOS transistor MP1 and a NMOS transistor MN1 are serially connected and to be the output stage driving transistor of the operation amplifier OPA1. A load resistance R1 of the operation amplifier OPA1 is provided. In the scheme, the input signal source V1 is connected to the first input terminal of the operation amplifier OPA1 and the gates of the PMOS transistor MP1 and the NMOS transistor MN1 are respectively connected to the output terminals of the operation amplifier OPA1. The load resistance R1 represents the impedance of the external device, which is under measured, and is connected to the of the operation amplifier OPA1 to the second input terminal of the operation amplifier OPA1 via the common node NO3 of the drains of the MP1 and MN1. A further pair of PMOS transistor MP2 and the NMOS transistor MN2 is connected to the previous pair of MP1 and MN1. The sources of the MP1 and MP2 are connected to the reference potential VDD via a common node. The sources of the MN1 and MN2 are connected to the ground potential VSS via another common node. It has to be note, the gates of the MP1 and MP2 are connected to the first output terminals of the OPA1 via the common node NO1. Similarly, the gates of the MN1 and MN2 are connected to the second output terminals of the OPA1 via the common node NO2. The characteristics of the MP1 and MP2 are almost identical and the ones of the MN1 and MN2 are also the same.

A controlled potential source V12 is used to maintain the balance state of the bridge at any time. The term balance herein means to maintain the potential level of the node NO3 is equal the one of the node NO4. The node NO4 is located between the drains of the MOS MP2 and MN2. The first input terminal V1 of the V12 is connected to the node NO3. The second input terminal V2 of the V12 is connected to the drains of the MOS MP2 and MN2. The output potential of the controlled potential source V12 is the function of the difference potential between the controlled terminals V1 and V2. A detecting resistance R2, is connected to the node NO4 and another end is connected to the output of the controlled potential source V12. The current flowed through the R1 will be detected by detecting the resistance of R2. The current flows through resistance R2 is the value of the R1 with a proportion determined by the characteristic of the bridge consisting of the four transistors.

As known in the art, the elements of the present invention illustrated in the embodiment is an example, the transistors can be replaced by the means for amplifying with equivalent function. The OPA1 can be designed by any type with the capability of calculation. The OPA1, MP1 and MP1 construct the scheme of the voltage follower and the inverted amplifier or the non-inverted amplifier may replace the voltage follower. In the present invention, the output level of the OPA1 is formed by the complementary structure consisting of MOS and PMOS. The controlled potential source V12 may includes an amplifier and a differential amplifier. The person skilled in the art can connect them.

The operation of the present invention is illustrated as follows. When the OPA1 receives the signal from the source V1, the MP1 and MN1 provide the current and the amplified signal is fed to the resistance R1. In one embodiment, the potential amplification of the present invention is about 1. Namely, the potential level of the node NO3 is approximately equal to the VIN (input potential). If the impedance of the external device is high, the current that flows through the R1 is small. Thus, there is no need to provide too much current by the transistors MP1 and MN1 due to the negative feedback system. Therefore, the signals of the node NO1 and NO2 are small. On the contrary, if the impedance of the external device is low, MP1 and MN1 have to provide enough current to the resistance R1. Thus, the signals of the node NO1 and NO2 are amplified. In another point of view, assume that the impedance R1 of the external device maintain the same, when the V1 increases, then the current that flows the resistance R1 is also increased. The signals of the NO1 and NO2 are also amplified, vice verse.

In another words, the signals on the NO1, NO2 represent the current on the resistance R1. Under the scheme of the balancing bridge consisting of MN1, MP1, MP2 and MN2, the current of the MP1 is approximately identical to the one of the MP2. The present invention implants an additional controlled potential source V12 at the right side of the balancing bridge to maintain the balance state of the balancing bridge, thereby constructing the self-balanced active current bridge for measuring the impedance of the external device or the output current. If there is current that flows through the resistance R1 and the current breaks the balance state, the current on the resistance R2 will response the change and keep a certain relationship with the current on R1. For example, the balancing bridge is designed with the approximately identical potential on the node NO3, NO4 and the currents that flow through are the same. Then, the current on the R2 is equal to the one on the R1. Finally, the resistance of the external device or output current can be determined by measuring the physical parameters such current or impedance of the R2 without influencing the subject matter that is under testing.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A self-balanced active current bridge for measuring the impedance of an external device or an output current, comprising:

an input signal source;

an operation amplifier connected to said input potential source via a first input terminal of said operation amplifier;

a balancing bridge coupled to a first output terminal and a second output terminal of said operation amplifier;

a controlled potential source coupled to said balancing bridge and used to maintain the balance state of said balancing bridge;

a resistance connected between said balancing bridge and an output terminal of said controlled potential source;

wherein said external device connects a first node between said balancing bridge and a second input terminal of said operation amplifier;

wherein said controlled potential source is coupled to said balancing bridge to maintain the balance state, thereby constructing the self-balanced active current bridge for measuring the impedance of said external device or the output current by means of measuring the potential variation of said resistance.

2. The self-balanced active current bridge of claim 1, wherein said balancing further comprising:
a first driving means for providing current to said external device;
a second driving means, wherein said first driving means and said second driving means are connected to a reference voltage of voltage supplier and ground potential, thereby constructing said balancing bridge;
wherein said controlled potential source is coupled the output of said second driving means for sending current or potential to said balancing bridge, and there is a feedback system formed between said balancing bridge and said controlled potential source for said second driving means to follow the change of said first driving means, thereby maintain said balancing state and obtaining the output state of said external device driven by said first driving means by using said second driving means.

3. The self-balanced active current bridge of claim 2, wherein said first driving means is consisted of a first PMOS transistor and a first NMOS transistor, said second driving means is consisted of a second PMOS transistor and a second NMOS transistor.

4. The self-balanced active current bridge of claim 3, wherein the gates of said first PMOS transistor and said second PMOS transistor are coupled to said first output terminal of said operation amplifier.

5. The self-balanced active current bridge of claim 3, wherein the gates of said first NMOS transistor and said second NMOS transistor are coupled to said second output terminal of said operation amplifier.

6. The self-balanced active current bridge of claim 3, wherein the sources of said first PMOS transistor and said second PMOS transistor are coupled to said reference voltage.

7. The self-balanced active current bridge of claim 3, wherein the drain of said first PMOS transistor is coupled to the drain of said first NMOS transistor, wherein the drain of said second PMOS transistor is coupled to the drain of said second NMOS transistor.

8. The self-balanced active current bridge of claim 3, wherein the sources of said first NMOS transistor and said second NMOS transistor are coupled to said ground potential.

9. The self-balanced active current bridge of claim 3, wherein said first node is coupled to said common drain of said first PMOS transistor and said first NMOS transistor.

10. The self-balanced active current bridge of claim 3, wherein said resistance is connected to said second driving means via a second node that is coupled to said common drain of said second PMOS transistor and said second NMOS transistor.

11. The self-balanced active current bridge of claim 1, wherein the output potential of said controlled potential source is the function of the difference potential between the first and second input terminals, wherein said first input terminal of said controlled potential source is coupled to said second input terminal of said operation amplifier via said common drain of said first PMOS transistor and said first NMOS transistor, and said second input terminal of said controlled potential source is coupled to said common drain of said second PMOS transistor and said second NMOS transistor.

12. The self-balanced active current bridge of claim 1, wherein said controlled potential source is consisted of another operation amplifier and a differential amplifier.

* * * * *